(12) United States Patent
Yamazaki et al.

(10) Patent No.: US 7,154,148 B2
(45) Date of Patent: *Dec. 26, 2006

(54) HYBRID CIRCUIT AND ELECTRONIC DEVICE USING SAME

(75) Inventors: Shunpei Yamazaki, Tokyo (JP); Satoshi Teramoto, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/799,722

(22) Filed: Mar. 15, 2004

(65) Prior Publication Data

US 2004/0173849 A1 Sep. 9, 2004

Related U.S. Application Data

(63) Continuation of application No. 10/353,164, filed on Jan. 27, 2003, now Pat. No. 6,710,410, which is a continuation of application No. 09/916,916, filed on Jul. 26, 2001, now Pat. No. 6,515,334, which is a continuation of application No. 09/008,098, filed on Jan. 16, 1998, now Pat. No. 6,331,722.

(30) Foreign Application Priority Data

Jan. 18, 1997 (JP) ............................... 9-019802
Jan. 20, 1997 (JP) ............................... 9-022078

(51) Int. Cl.
H01L 29/72 (2006.01)

(52) U.S. Cl. .................. 257/347; 257/350; 257/351; 257/352; 257/621; 257/622; 257/624; 257/777; 455/556.1

(58) Field of Classification Search ............... 257/347, 257/350, 351, 352, 621, 622, 624, 777; 455/556.1
See application file for complete search history.

(56) References Cited

U.S. PATENT DOCUMENTS

| | | | |
|---|---|---|---|
| 5,313,076 A | 5/1994 | Yamazaki et al. | |
| 5,395,804 A | 3/1995 | Ueda | |
| 5,583,369 A | 12/1996 | Yamazaki et al. | |
| 5,608,232 A | 3/1997 | Yamazaki et al. | |
| 5,639,698 A | 6/1997 | Yamazaki et al. | |
| 5,643,804 A * | 7/1997 | Arai et al. ................... | 438/155 |
| 5,696,386 A | 12/1997 | Yamazaki | |
| 5,877,533 A | 3/1999 | Arai et al. | |
| 5,897,347 A | 4/1999 | Yamazaki et al. | |
| 5,946,561 A | 8/1999 | Yamazaki et al. | |

(Continued)

FOREIGN PATENT DOCUMENTS

| | | |
|---|---|---|
| EP | 0 612 102 | 8/1994 |
| EP | 1 119 053 | 7/2001 |
| GB | 2046514 | 11/1980 |
| JP | 54-040583 | 3/1979 |
| JP | 57-133698 | 8/1992 |
| JP | 04-260363 | 9/1992 |
| JP | 04-323876 | 11/1992 |
| JP | 05-315357 | 11/1993 |
| JP | 06-132421 | 5/1994 |
| JP | 06-209168 | 7/1994 |
| JP | 06-244103 | 9/1994 |
| JP | 06-296023 | 10/1994 |
| JP | 07-014982 | 1/1995 |
| JP | 07-045787 | 2/1995 |

*Primary Examiner*—Edward Wojciechowicz
(74) *Attorney, Agent, or Firm*—Fish & Richardson P.C.

(57) ABSTRACT

There is disclosed a hybrid circuit in which a circuit formed by TFTs is integrated with an RF filter. The TFTs are fabricated on a quartz substrate. A ceramic filter forming the RF filter is fabricated on another substrate. Terminals extend through the quartz substrate. The TFTs are connected with the ceramic filter via the terminals. Thus, an RF module is constructed.

40 Claims, 14 Drawing Sheets

U.S. PATENT DOCUMENTS

| | | |
|---|---|---|
| 5,956,579 A | 9/1999 | Yamazaki et al. |
| 6,084,247 A | 7/2000 | Yamazaki et al. |
| 6,271,066 B1 | 8/2001 | Yamazaki et al. |
| 6,410,960 B1 | 6/2002 | Arai et al. |
| 6,562,672 B1 | 5/2003 | Yamazaki et al. |
| 6,710,410 B1 * | 3/2004 | Yamazaki et al. .......... 257/347 |
| 6,997,985 B1 | 2/2006 | Yamazaki et al. |
| 2001/0051416 A1 | 12/2001 | Yamazaki et al. |

* cited by examiner

HYBRID CIRCUIT AND ELECTRONIC DEVICE USING SAME

CROSS-REFERENCE TO RELATED APPLICATION

This application is a continuation (and claims the benefit of priority under 35 USC 120) of U.S. application Ser. No. 10/353,164, filed Jan. 27, 2003 (U.S. Pat. No. 6,710,410), which is a continuation of U.S. application Ser. No. 09/916,916, filed Jul. 26, 2001 (now U.S. Pat. No. 6,515,334), which is a continuation of U.S. application Ser. No. 09/008,098, filed Jan. 16, 1998 (now U.S. Pat. No. 6,331,722), which claims the benefit from foreign priority applications filed in Japan on Jan. 18, 1997, as Ser. No. 09-019802 and on Jan. 20, 1997 as Ser. No. 09-022078. This application claims priority to each of these prior applications, and the disclosures of the prior applications are considered part of (and are incorporated by reference in) the disclosure of this application.

BACKGROUND OF THE INVENTION

1. Field of the Invention

The present invention relates to a structure in which thin-film transistors (TFTs) are integrated with a ceramic device or with a ferrite device. The invention disclosed herein can be used in a small-sized, lightweight intelligent terminal typified by a mobile phone for example.

2. Description of the Prior Art

In recent years, research has been carried out on techniques for fabricating transistors, using a thin silicon film formed on a substrate of quartz or glass. Some of them have been commercialized. These transistors are known as thin-film transistors (TFTs).

The main purpose of the research into TFTs is to use them in liquid crystal displays. Such a liquid crystal display has a number of pixels arranged in rows and columns. TFTs are disposed as switching devices at the locations of the pixels. Electric charge held on pixel electrodes is controlled by the TFTs.

A still advanced structure that is known has a peripheral driver circuit consisting of TFTs, similarly to an active matrix circuit. This configuration achieves ever larger scales of integration.

Furthermore, it is considered to construct from TFTs circuits for handling graphics information and for exchanging information with the outside, as well as the peripheral driver circuit. Thus, the whole structure is systematized.

Recently, intelligent terminals having various information-processing functions have attracted attention. These intelligent terminals are also termed mobile computers and have various functions such as communications functions (such as fax and telephone). information storage functions, and arithmetical processing functions.

The intelligent terminals described above are required to be small and light enough to provide portability. In addition, they are required to have a thin-film display (also known as a flat panel display) to handle graphics information. Of course, an intelligent terminal needs a circuit for exchanging information with an external device.

It would be inevitable that more cordless information-transmitting means are used. In particular, there is a demand for a function of exchanging information, using electromagnetic waves in the GHz band or higher permitting exchange of high-density information. Accordingly, the intelligent terminal described above must be a small-sized, lightweight device incorporating a radio-frequency circuit capable of sending and receiving electromagnetic waves in the GHz band.

Generally, this radio-frequency circuit comprises transistors integrated with a filter element (such as an inductor or capacitor in chip form or an SAW device). These transistors use a single-crystal silicon wafer or compound semiconductors. In the future, more functions will be required. Furthermore, smaller size, reduced weight, and lower cost will be necessitated. In spite of these technical trends, it is now difficult to increase the device density further.

SUMMARY OF THE INVENTION

It is an object of the present invention to provide a novel device in which a radio-frequency circuit capable of handling radio frequencies in the GHz band is integrated with other component.

The present invention provides a device comprising a substrate having TFTs fabricated on an insulating surface, terminals connected with the TFTs and extending through the substrate, and a laminated device connected with the terminals.

Also, the invention provides a device comprising a first substrate having TFTs fabricated on an insulating surface and a second substrate having a laminated device. These first and second substrates are bonded together. Terminals extend through the first substrate to connect the TFTs with the laminated device.

The laminated device can consist of layers of magnetic or dielectric materials. One example of magnetic material is a ferrite that is one kind of ceramic material.

In one preferred embodiment of the invention, the above-described radio-frequency circuit is made up of TFTs, and the laminated device forms a filter circuit.

Heat generated by the TFTs can be effectively radiated by forming a heat-radiating layer on the first substrate. Preferably, the heat-radiating layer is made of a material of high thermal conductivity such as aluminum nitride.

Moreover, the invention provides a device comprising a first substrate and a second substrate that are bonded together. The first substrate has an insulating substrate on which TFTs are fabricated. Passive components are fabricated on the second substrate. Terminals extend through the first substrate to connect the TFTs with the passive components.

The heat-radiating layer can be made of aluminum nitride (AlN). Besides, the layer can be made of aluminum nitride to which oxygen is added, (AlON). In addition, the layer can be made of crystalline compounds of Si, Al, O, and N that are collectively known as SIALON. Further, the layer can be made of AlONC. These materials are effective in relieving the stress between the substrate and the device and controlling the thermal conductivity, and have various features including electrical insulation, high thermal conductivity, heat resistance, and optical transparency.

In addition, the invention provides a device comprising first and second substrates bonded together. A circuit is fabricated from TFTs on the bonded surface of the first substrate. Another circuit is fabricated from a ceramic device on the bonded surface of the second substrate. These two circuits are connected together.

In this configuration, heat generated by the TFTs can be effectively radiated by a heat-radiating layer formed on the first substrate.

Also, the ceramic device can be fabricated, using a dielectric or magnetic material. The ceramic device can be fabricated, using a ferrite.

The heat-radiating layer can be made of aluminum nitride (AlN). Besides, the layer can be made of aluminum nitride to which oxygen is added, or AlON. In addition, the layer can be made of crystalline compounds of Si, Al, O, and N that are collectively known as SIALON. Further, the layer can be made of AlONC.

These materials are effective in relieving the stress between the substrate and the device and controlling the thermal conductivity, and have various features including electrical insulation, high thermal conductivity, heat resistance, and optical transparency.

DESCRIPTION OF THE PREFERRED EMBODIMENTS

Figure 3A:
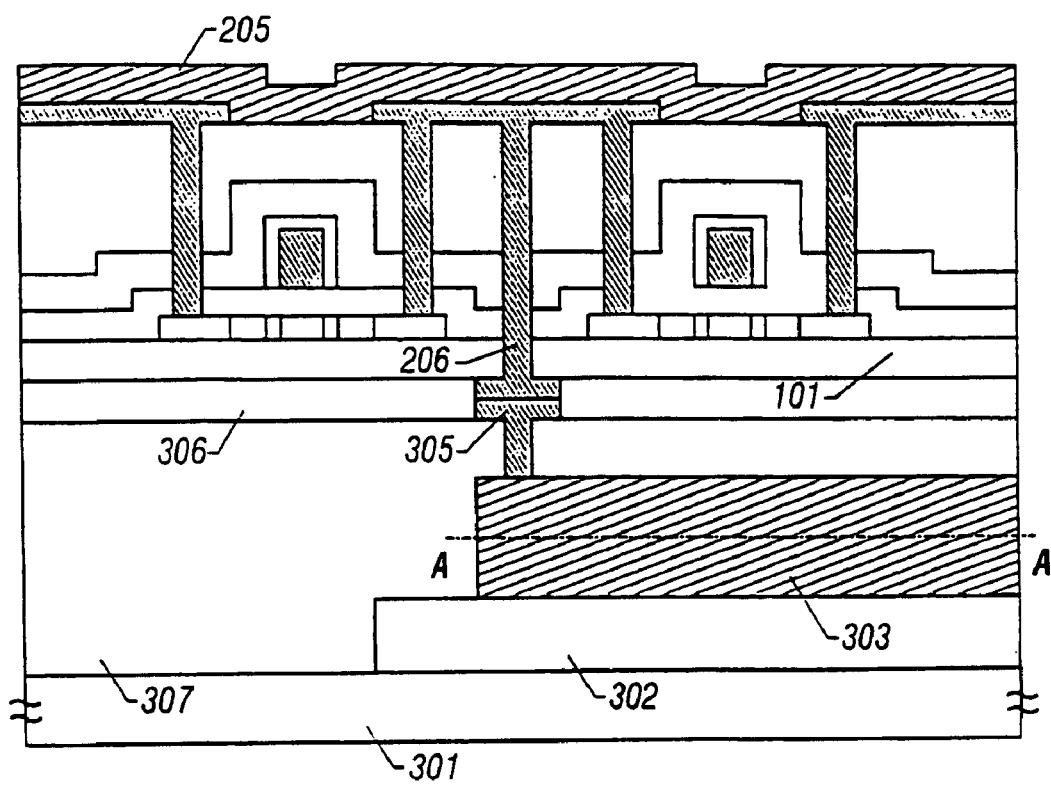
FIG. 3(A) is a cross-sectional view of a hybrid circuit consisting of TFTs and an SAW filter, the hybrid circuit being built in accordance with the invention.
Figure 3B:
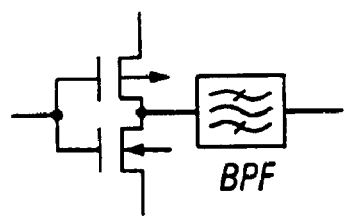
FIG. 3(B) is an equivalent circuit diagram of the hybrid circuit shown in FIG. 3(A)

Referring to FIG. 3(A), TFTs are integrated on a quartz substrate 101. A ceramic device such as an SAW filter is fabricated in IC form on another substrate 301. These two substrates are bonded together. The quartz substrate 101 is provided with openings. The TFTs are connected with the ceramic devices via contact metal lines 206 extending through the openings. Thus, a module in which the TFTs are integrated with the passive component, or the ceramic filter, can be constructed as shown in FIG. 3(B).

The passive component may also consist of inductor, capacitor, resistor, or other component. Furthermore, oscillating components may be integrated.

Figure 10A:
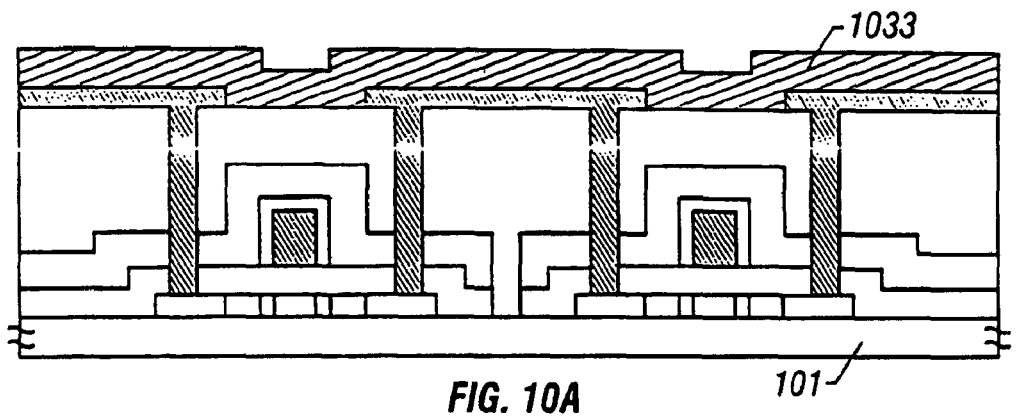
FIGS. 10(A) and 10(B) are cross-sectional views of a hybrid device consisting of TFTs and an SAW filter, the hybrid device being built in accordance with the invention.
Figure 10B:
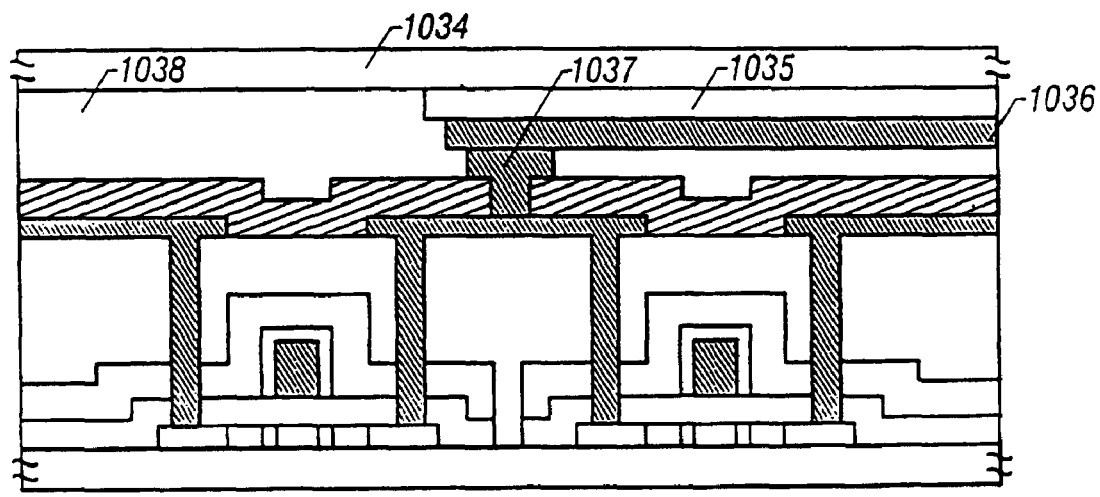

Referring next to FIGS. 10(A) and 10(B), there is shown another hybrid device comprising a TFT circuit and an SAW filter component. The TFT circuit is built on a quartz substrate 101. The SAW filter component is fabricated on a quartz substrate 1034. These two substrates are bonded together, completing the hybrid device. In this way, the TFT circuit is integrated with the ceramic device.

Integrating TFTs on a quartz substrate yields the following advantages:

(1) The substrate shape can be determined with high selectivity.

(2) Large areas can be accomplished.

(3) The components of an active matrix display can be integrated on the same substrate.

(4) The problems of stress occurring where the device density is enhanced can be mitigated.

EMBODIMENT 1

A process sequence for the present embodiment is illustrated in FIGS. 1(A)–3(C). The present embodiment consists of TFTs integrated with an SAW (surface acoustic wave) filter. The SAW filter acts as a BPF (band-pass filter). In this embodiment, the TFTs form a CMOS circuit having an output with which the SAW filter is connected.

Figure 1A:
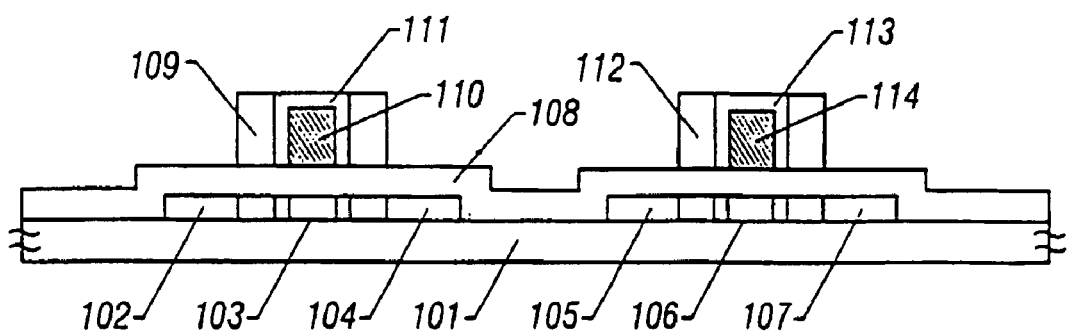
FIGS. 1(A)–1(D), 2(A)–2(C) are cross-sectional views of TFTs, illustrating a process sequence for fabricating the TFTs in accordance with the present invention.

First, an active layer, 103 and 106, for the TFTs is formed from a crystalline semiconductor, film such as silicon film, on a quartz substrate 101, as shown in FIG. 1(A), in a manner described below. Then, a gate insulator film 108 is formed by depositing a silicon oxide film and a thermal oxide film in succession by plasma CVD.

Thereafter, aluminum metallization from which gate electrodes will be formed is deposited. Then, a porous anodic oxide film, 109 and 112, is formed by anodic oxidation. Subsequently, a dense anodic oxide film, 111 and 113, presenting a barrier is formed by anodic oxidation. Also, gate electrodes 110 and 114 are created.

The qualities of these two kinds of anodic oxide can be determined by selection of the kind of the electrolyte used during the anodization. In this way, a state as shown in FIG. 1(A) is obtained.

Then, dopant elements are implanted under such conditions that source and drain regions are formed. In this embodiment, a P-channel TFT is formed to the left, while an N-channel TFT is formed to the right. This processing step is carried out by selectively implanting the dopant elements for imparting P- and N-type conductivities by a plasma doping method, while selectively masking regions where TFTs are to be fabricated with a resist mask.

In this processing step, a source region 102 and a drain region 104 for the P-channel TFT are formed by self-alignment techniques. Similarly, a source region 107 and a drain region 105 for the N-channel TFT are formed in a self-aligned manner.

Figure 1B:
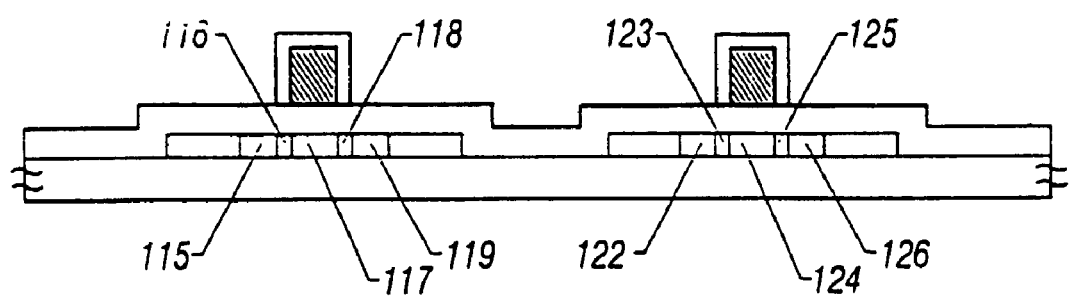

Then, the porous anodic oxide film, 109 and 112, is selectively removed. Thus, a state as shown in FIG. 1(B) is obtained. Under this condition, doping is again done but with a lower dose. During this to fabrication step, regions 115, 119, 122, and 126 are lightly doped. The regions 115 and 119 become lightly doped regions for the P-channel TFT. The regions 122 and 126 become lightly doped regions for the N-channel TFT. Also formed are offset gate regions 116, 118, 123, 125 and channel regions 117, 124. As a result, the state of FIG. 1(B) is derived.

Then, a silicon nitride film 128 is formed as an interlayer dielectric film by plasma CVD. Subsequently, a polyimide resinous film 129 is spin-coated.

Where the interlayer dielectric film is made from a resinous material, the surface can be planarized. This is favorable for later formation of conductive interconnects. The resinous material can be selected from polyamide, polyimidamide, acrylic resin, epoxy resin, as well as polyimide.

Figure 1C:
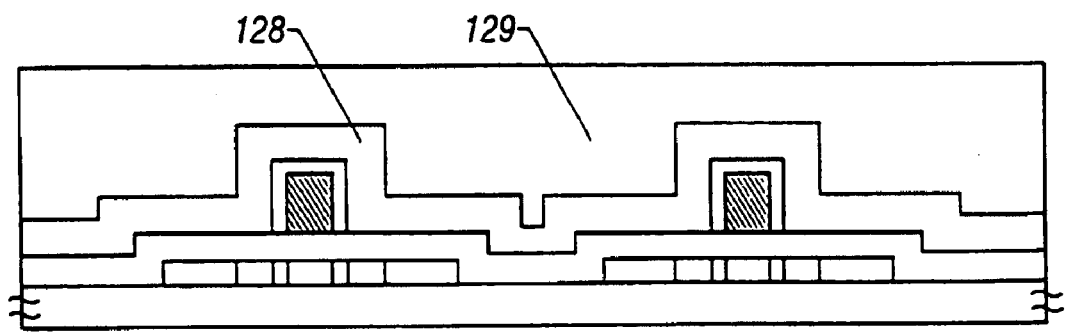

In consequence, a state as shown in FIG. 1(C) is obtained. Contact holes are formed. Also, source electrode and source interconnects 130 for the P-channel TFT, source electrode and source interconnects 132 for the N-channel TFT, and drain electrode and drain interconnects 131 common to both TFTs are formed.

Figure 1D:
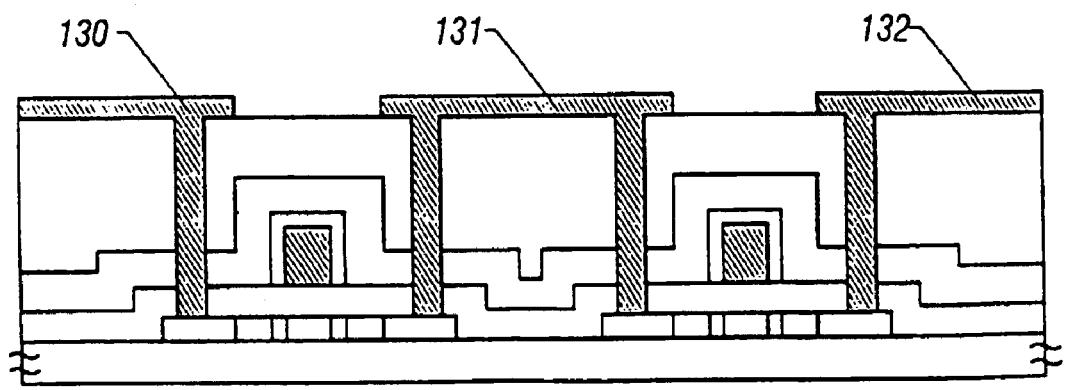
Figure 2A:
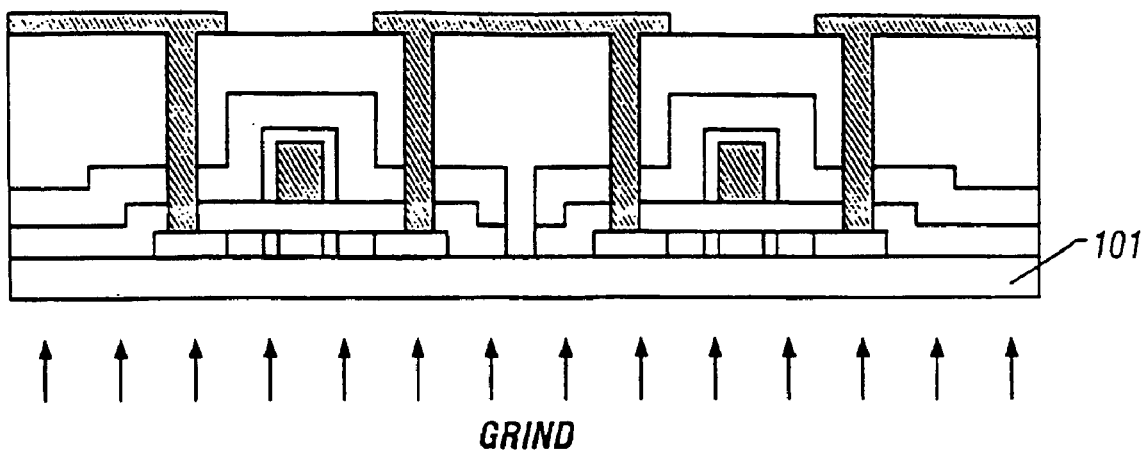

In this manner, a state shown in FIG. 1(D) is derived. The rear surface of the quartz substrate 101 is polished to thin the substrate as shown in FIG. 2(A).

Figure 2B:
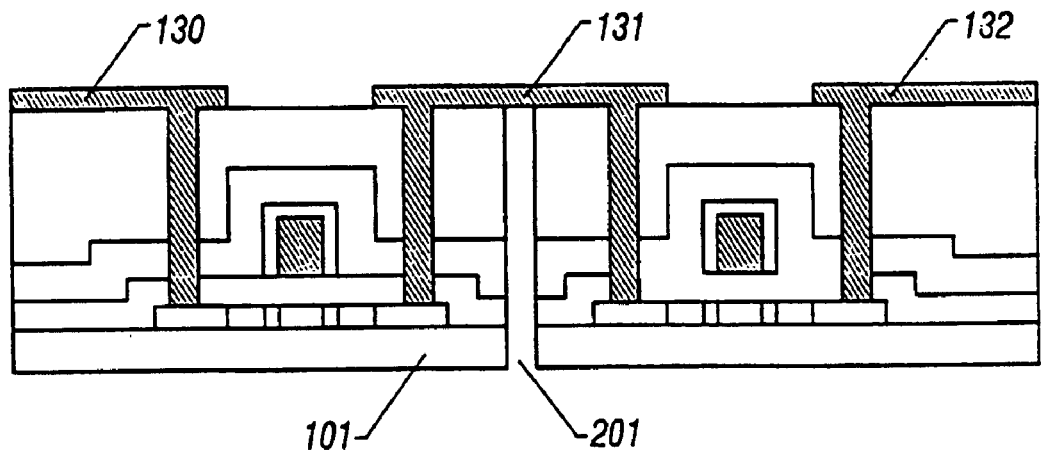
Figure 2C:
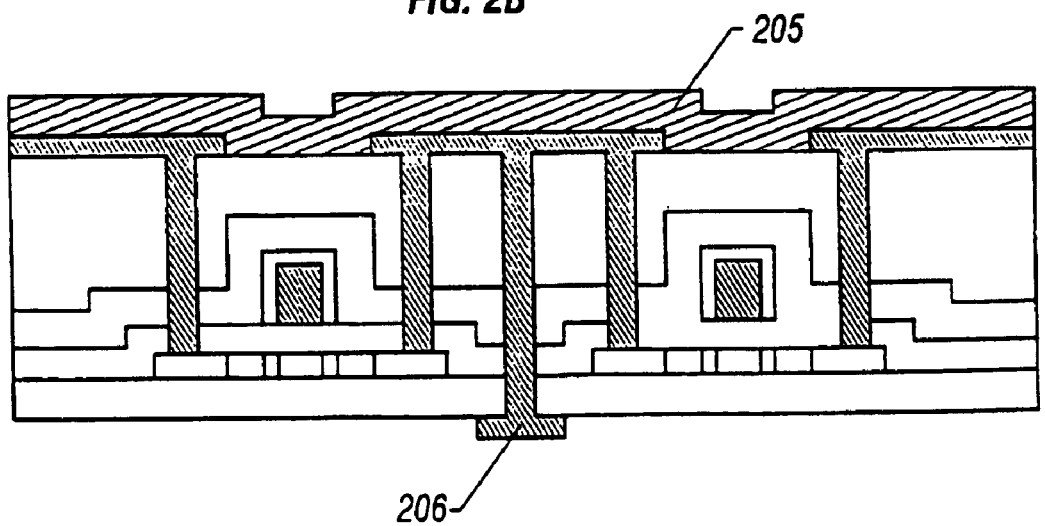

Then, openings 201 extending to the drain electrode and drain interconnects 203 are formed, as shown in FIG. 2(B). Electrode terminals 206 extending to the rear surface of the substrate 101 through the openings 201 are formed as shown in FIG. 2(C). This is followed by formation of an aluminum nitride film 205 acting to radiate heat generated from the TFTs.

After obtaining the state shown in FIG. 2(C), the quartz substrate 101 and the quartz substrate 301 having the SAW filter thereon are bonded together via an adhesive layer 306, as shown in FIG. 3(A). This adhesive layer 306 may comprise an adhesive binder in which fine particles having electrical conductivity are dispersed. The adhesive layer exhibits electrical conductivity in the direction of thickness.

Figure 3C:
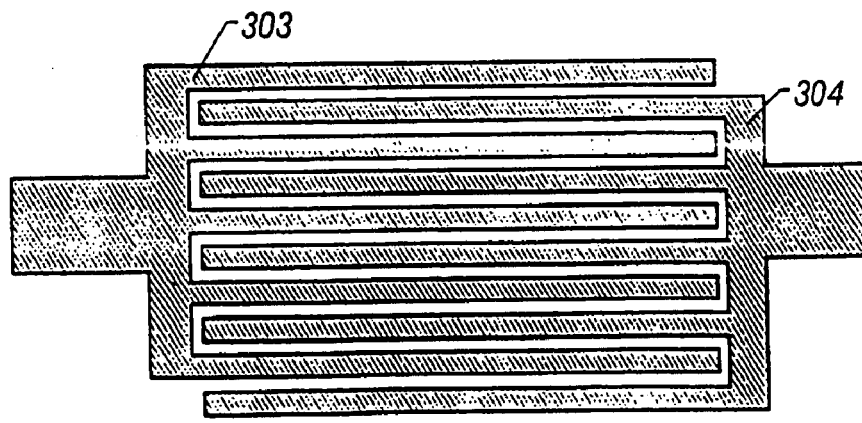
FIG. 3(C) is a plan view of the hybrid circuit shown in FIG. 3(A)

The SAW filter is fabricated by forming a barium titanate film 302 on the quartz substrate 301. Comb-shaped electrodes 303 and 304 having a pattern as shown in the top view of FIG. 3(C) are created. An interlayer dielectric film 307 is made from a resinous material.

One electrode 303 of the SAW filter has a contact electrode 305 coming into contact with an electrode terminal 206 extending through the quartz substrate 101 having the TFTs thereon.

The configuration of FIG. 3(A) is represented in terms of an equivalent circuit of FIG. 3(B). This circuit comprises a CMOS circuit and a band-pass filter connected to the output of the CMOS circuit. The filter consists of the SAW filter.

The structure of the present embodiment permits various circuits made up of transistors to be integrated with a filter component, thus building a modular construction. Consequently, a radio-frequency module that can be used in a mobile phone or in a portable intelligent terminal can be accomplished.

Use of such modularized components makes it possible to reduce the sizes of mobile phones and portable intelligent terminals. In addition cost reductions can be achieved.

PROCESS SEQUENCE FOR TFTS

Figure 4A:
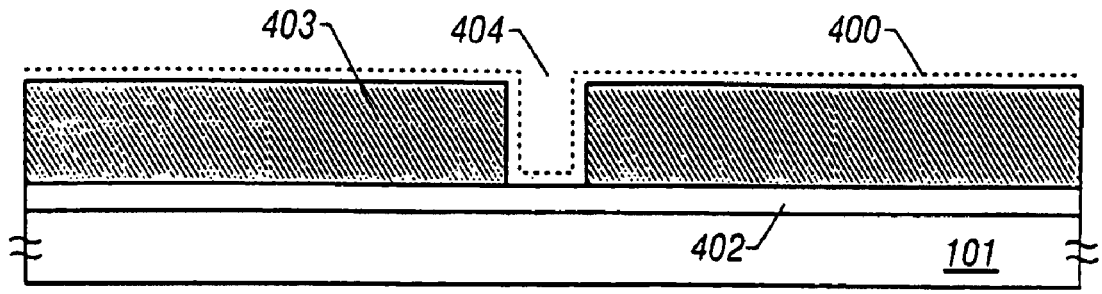
FIGS. 4(A)–4(D) are cross-sectional views of other TFTs, illustrating a process sequence for fabricating the TFTs in accordance with the invention.

A process sequence for fabricating the TFTs up to the state shown in FIG. 1(A) is described now. First, as shown in FIG. 4(A), an amorphous semiconductor film, such as a silicon film, 402 is formed to a thickness of 500 Å on the quartz glass substrate 101 by LPCVD. It is important that the surface of the quartz substrate have a sufficient degree of flatness.

Then, a mask 403 is fabricated from a silicon oxide film. Openings 404 are formed in this mask 403. The amorphous silicon film 402 is exposed at these openings 404 that are elongated in the rearward direction as viewed in the figure.

Then, nickel acetate salt solution containing 100 ppm (by weight) nickel is applied by spin-coating. As a result, nickel is maintained in contact with the surface (FIG. 4(A)). The nickel can be introduced by CVD, sputtering, plasma processing, ion implantation, or other method. Besides the nickel, other element selected from the group consisting of Fe, Co, Ru, Rh, Pd, Os, Ir, Pt, Cu, and Au can be used.

Figure 4B:
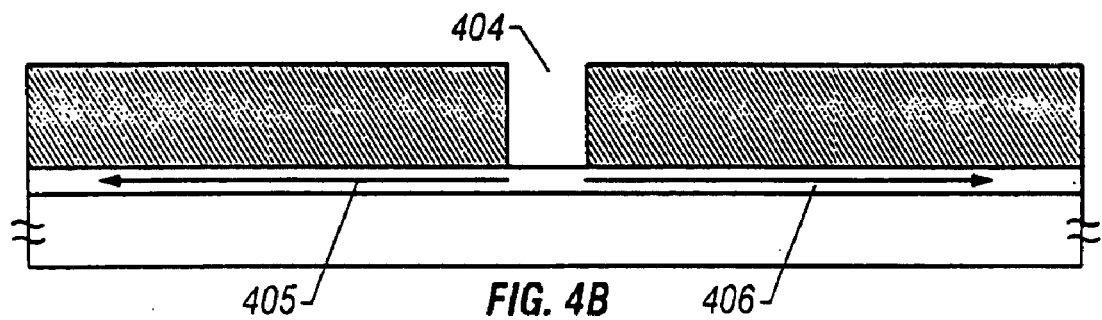

Thereafter, a heat treatment is conducted at 600° C. for 8 hours in a nitrogen ambient at normal pressure. During this processing step, crystal growth progresses in a direction indicated by 405 parallel to the substrate (FIG. 4(B)).

This heat treatment is carried out in an electric furnace, resulting in a multiplicity of pillar-shaped crystalline structures having diameters of tens to hundreds of nanometers. These crystalline structures are arrayed parallel to each other. The longitudinal direction of these crystalline structures agrees with the crystal growth direction indicated by 405. These crystalline structures are partitioned from each other by crystal grain boundaries extending along these crystalline structures. We have confirmed that these crystal grain boundaries are inactive. The above-described heat treatment can be performed at a temperature between approximately 450 and 1,100° C.

On completion of the heat treatment for the crystallization, the mask of silicon oxide film 403 is removed. Then, a heat treatment is conducted at 950° C. for 20 minutes in an oxygen ambient containing 3% by volume of HCl. During this processing step, a thermal oxide film grows to a thickness of 200 Å. The thickness of the silicon film decreases from 500 to 400 Å. Importantly, the thermal oxidation is performed at a heating temperature of 800 to 1,100° C., preferably 900 to 1,100° C.

In this process, as the thermal oxide grows, the number of dangling bonds of silicon atoms decreases, thus greatly reducing the defects in the film. This process step for forming the thermal oxide is important and assures that the final TFTs have excellent characteristics. This thermal oxide film contains a richer amount of nickel than the silicon film. Observation with an electron microscope has revealed that the formation of this thermal oxide film produces apparently cylindrical crystalline structures.

After the completion of the formation of the thermal oxide film, it is removed. In this way, the nickel element can be eliminated.

Figure 4C:
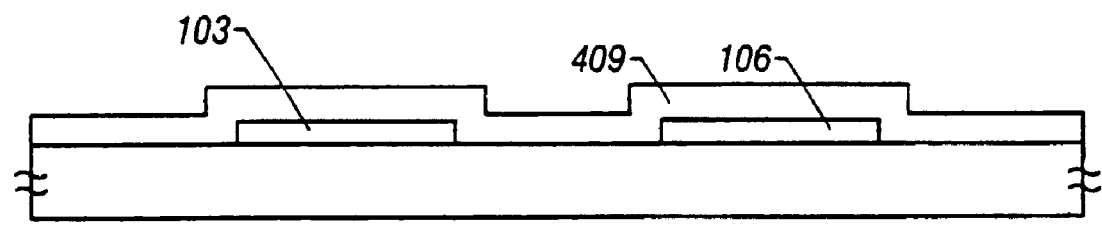

The obtained crystalline silicon film is patterned into shapes 103 and 106 shown in FIG. 4(C). The shape 103 forms an active layer for P-channel TFT and the shape 106 forms an active layer for N-channel TFTs. Then, a silicon oxide film (CVD oxide film) is grown to 200 Å by plasma CVD to form a gate insulator film 409. Then, second thermal oxidation is conducted to form a thermal oxide film.

During this step for forming the thermal oxide film, a heat treatment is conducted at 950° C. for 20 minutes in an oxygen ambient containing 3% by volume of HCl. During this processing step, a thermal oxide film is grown to a thickness of 200 Å.

This thermal oxide film is formed inside the previously grown CVD oxide film. i.e.. close to the boundary with the active layer. Thus, the thermal oxide film and the CVD oxide film are laminated from the inside, resulting in the gate insulator film 409. The thickness of the final active layer is 300 Å (FIG. 4(C)).

Figure 4D:
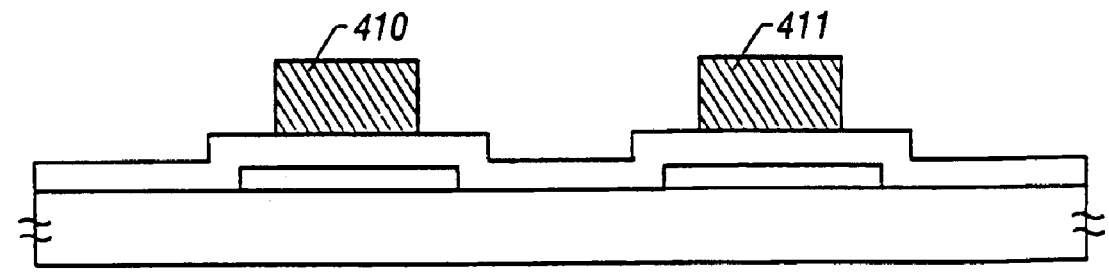

Then, an aluminum film containing a trace amount of scandium is formed to a thickness of 400 nm (4000 Å) by sputtering and patterned into shapes 410 and 411 (FIG. 4(D)) from which gate electrodes will be formed. The TFTs show characteristics comparable or superior to those of MOS transistors using a single-crystal silicon wafer.

Figure 8:
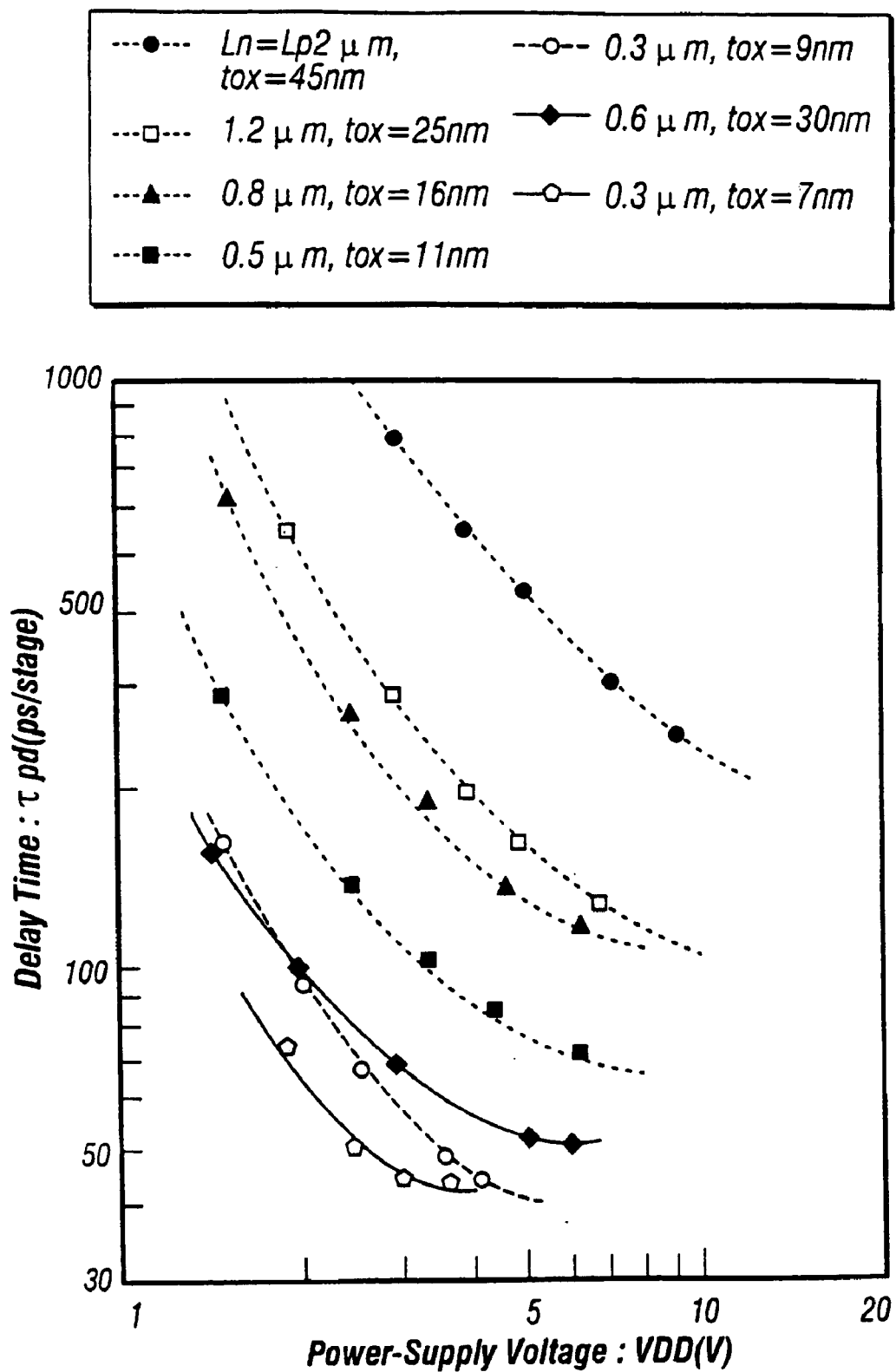
FIG. 8 is a graph illustrating the relation of the dimensions of MOS transistors to their characteristics.

Indicated by the solid line in FIG. 8 is one example of characteristic of a TFT having a gate insulator film having a thickness of 30 nm (300 Å) and a channel length of 0.6 μm. This TFT was fabricated with 2-μm design rules. To shorten the channel length, the side-surfaces of the gate electrodes are anodized.

Plotted on the horizontal axis is the voltage applied from a power supply. Plotted on the vertical axis is delay time corresponding to the inverse of the operating speed. As the delay time decreases, higher-speed operation is possible.

Indicated by the broken lines in FIG. 8 are data about MOS transistors using a single-crystal silicon wafer, comparing these transistors. The comparison data shown in FIG. 8 illustrate the scaling principles. i.e.. the relation between the dimensions (or, the channel length and the thickness of gate insulator film) and the delay time. The scaling principles are based on the concept that as the dimensions of MOS transistors are reduced, their radio-frequency characteristics are enhanced according to a certain rule. Of course, the principles are not strict ones.

The plotted points indicated by the broken lines in FIG. 8 roughly obey the scaling principles. It can be seen that the RF to characteristics of the TFT fabricated by a method in accordance with the present invention are higher than those forecasted from the prior art scaling principles by plural orders of magnitude. If the scaling principles for the MOS transistor using a single-crystal silicon wafer are obeyed, the delay time of the TFT plotted by the solid lines should have greater values.

For example, if the conventional scaling principles are observed, the delay time of a MOS transistor having a channel length of 0.6 μm and a gate insulator film thickness (tox) of 30 nm should be greater than at least the plotted delay time of a device having a channel length of 0.5 μm and a gate insulator film thickness (tox) of 11 nm. In this way, the TFT disclosed herein has characteristics exceeding those of the prior art MOS transistor.

EMBODIMENT 2

The present embodiment gives an example in which the configuration of FIG. 3(A) uses one or more substrates made of a ceramic. All the substrates can be made of a ceramic. Alternatively, the substrate on which TFTs or an SAW device is fabricated may be made of a ceramic. Where a ceramic substrate is employed, there is a wider choice of materials. This is advantageous for productivity and cost.

Where a ceramic substrate is used, it is important to select a substrate having excellent surface flatness. Especially, the substrate on which TFTs are fabricated must be free from pinholes, in addition to having excellent surface flatness.

EMBODIMENT 3

Figure 5:
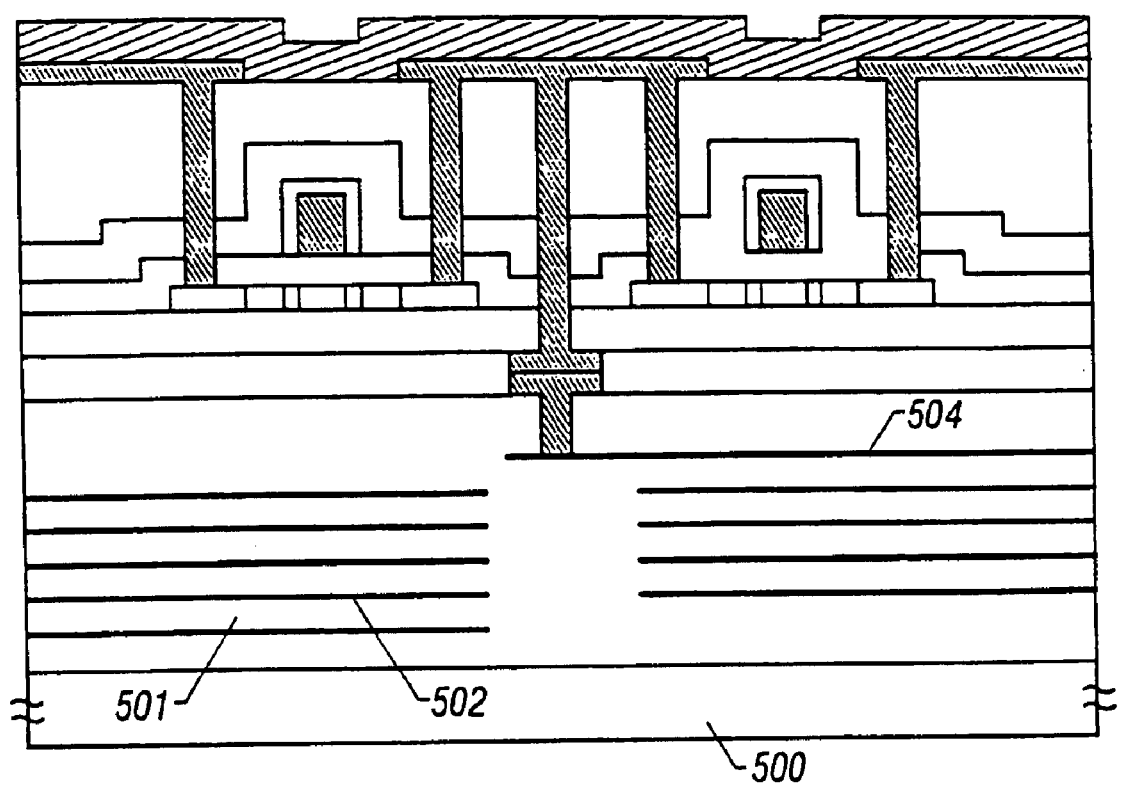
FIG. 5 is a cross-sectional view of a hybrid device consisting of TFTs and an inductor, the hybrid device being built in accordance with the invention.

The present embodiment gives an example in which the bandpass filter (BPF) consisting of an SAW filter is replaced by an inductor. FIG. 5 schematically shows the construction of the present embodiment. Those parts that are the same as shown in FIG. 3 have the same structures as shown in FIG. 3.

In FIG. 5, conductor patterns 502 form an inductor. A dielectric 501 exists between the successive conductor patterns. A pattern 504 forms one terminal of the inductor and is connected with the output of the invertor consisting of P- and N-channel TFTs. A pattern 503 forms another terminal of the inductor and extends to other components and conductive interconnects (not shown). A substrate 500 is made of a ceramic material.

In this embodiment, an inductor is disposed. Other devices such as chip capacitor, device using a piezoelectric material (e.g., voltage-controlled oscillator (VCO)), and devices exploiting ferrite can be disposed.

EMBODIMENT 4

Figure 6:
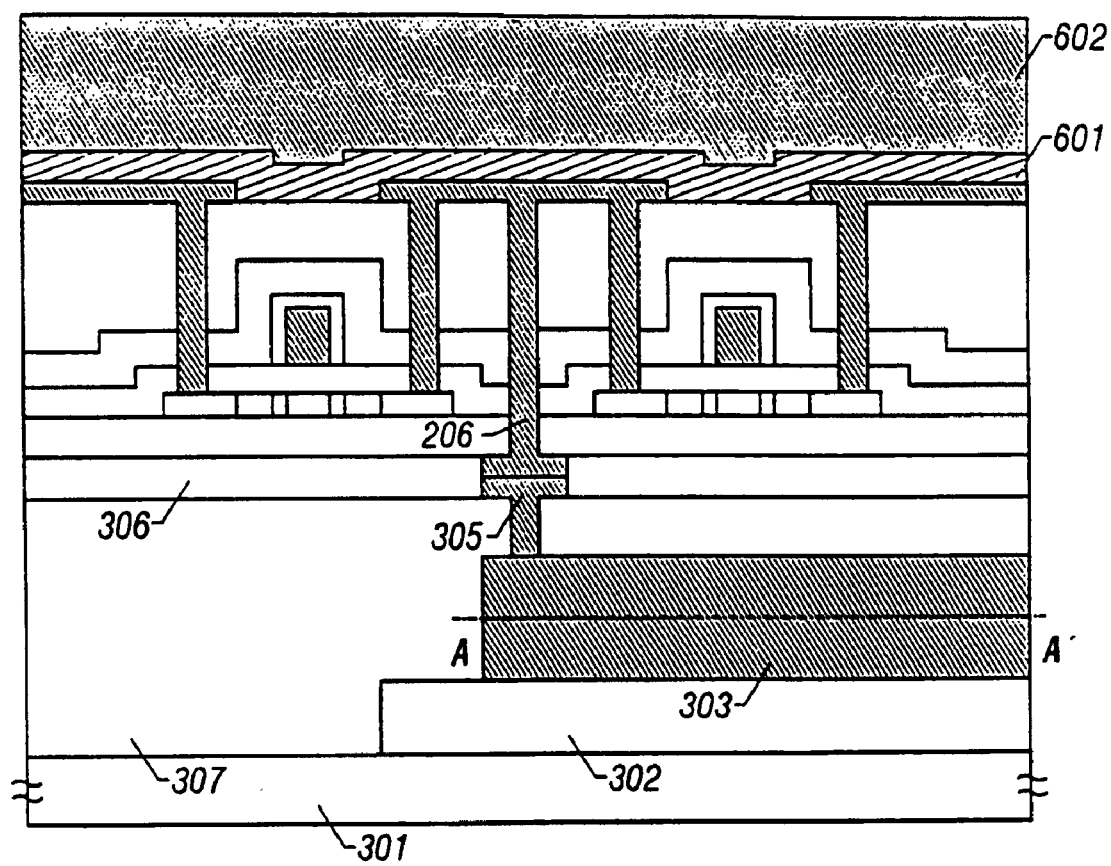
FIG. 6 is a cross-sectional view of a hybrid device consisting of TFTs and an SAW filter, the hybrid device being built in accordance with the invention.

The present embodiment is a modification of the configuration of FIG. 3. The construction of the present embodiment is schematically shown in FIG. 6. The present embodiment is characterized in that an aluminum film 602 is formed on an aluminum nitride film 601. Thus, heat generated by TFTs can be radiated at improved efficiency. This is useful in operating the TFTs at high speeds.

EMBODIMENT 5

Figure 7:
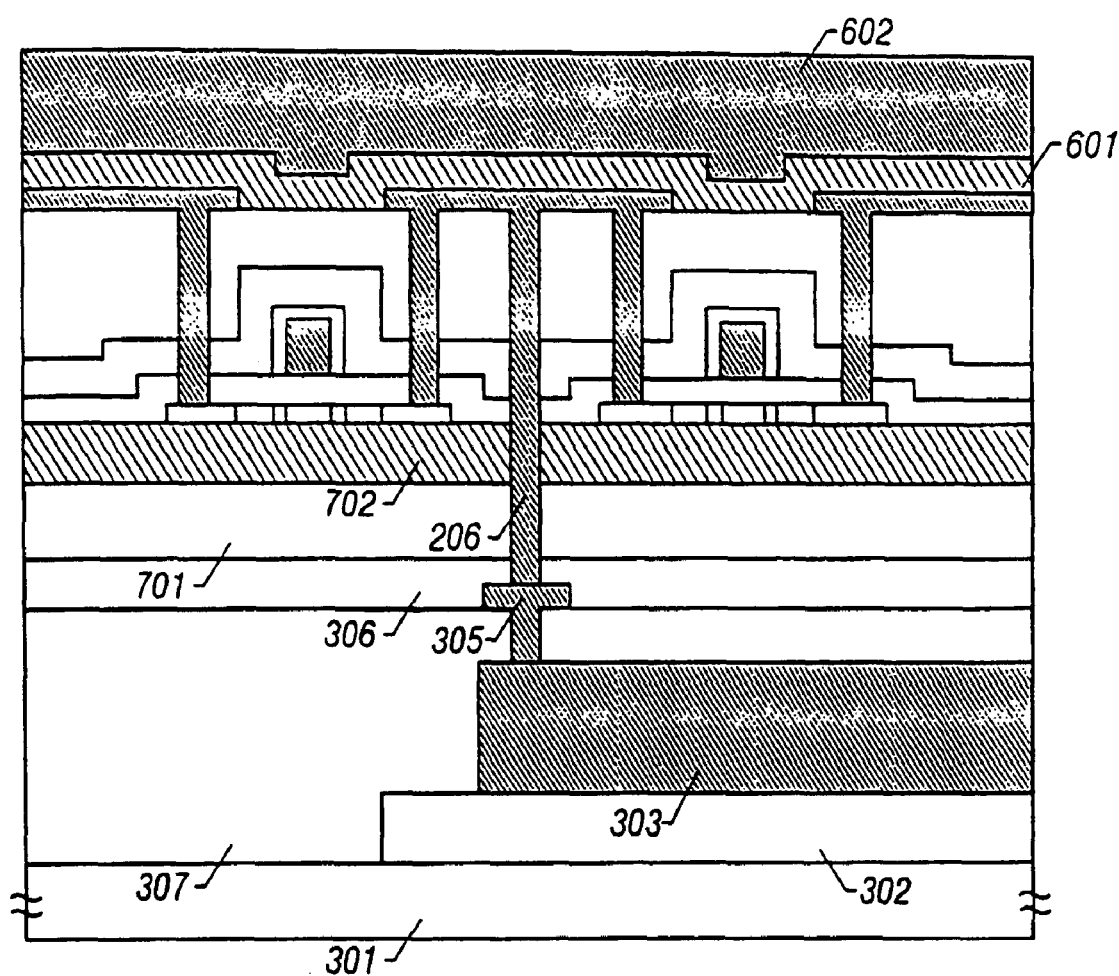
FIG. 7 is a view similar to FIG. 6, but showing another hybrid device in accordance with the invention.

The present embodiment gives an improvement of the configuration of Embodiment 4. The configuration of the present embodiment is schematically shown in FIG. 7. The present embodiment is characterized in that an aluminum nitride film 702 is formed on a quartz substrate 701. Consequently, heat generated by the active layers of TFTs can be effectively radiated.

EMBODIMENT 6

The present embodiment pertains to a structure of a modular marginal portion of the construction shown in FIG. 3(A). That is, the present embodiment relates to a method of mounting the module shown in FIG. 3(A) where the module is used for an apparatus.

Figure 9:
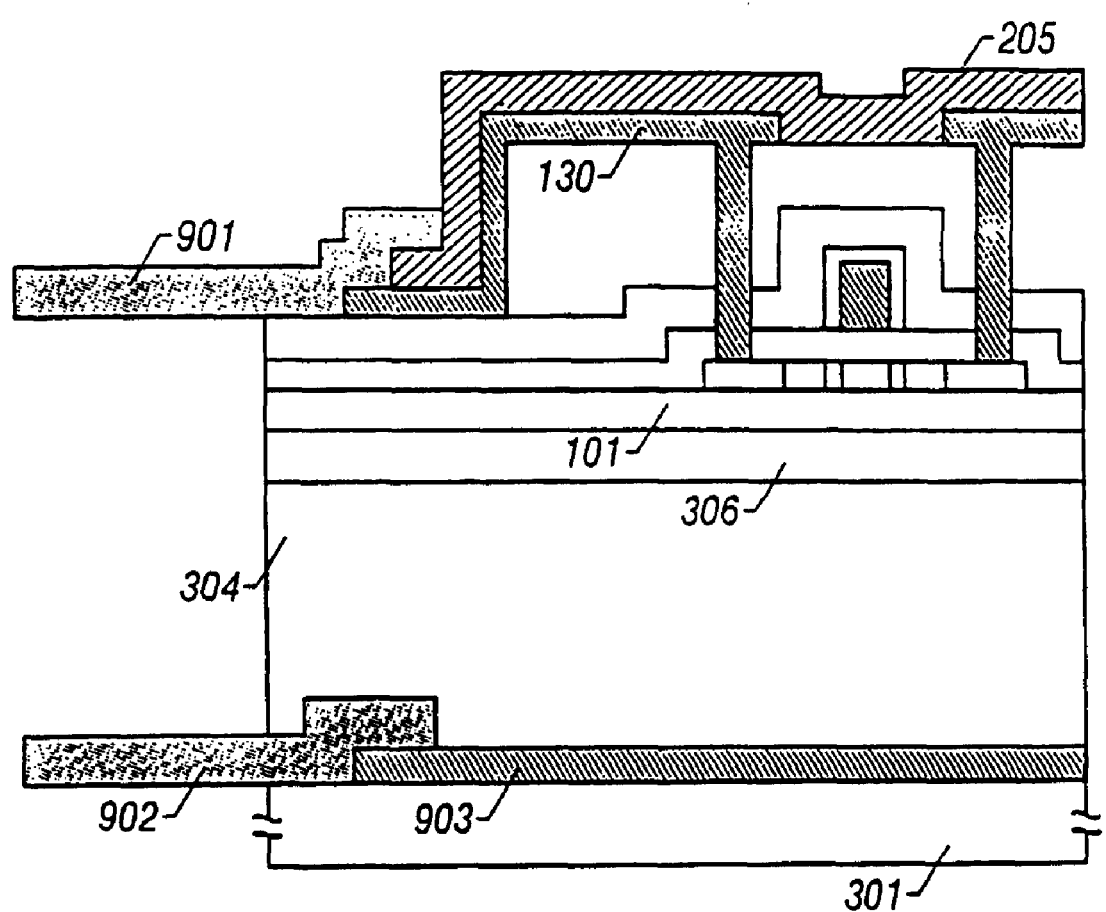
FIG. 9 is a fragmentary cross-sectional view of a marginal portion of a hybrid module in accordance with the invention.

FIG. 9 shows the structure of the modular marginal portion shown in FIG. 3(A). In FIG. 9, a conductive interconnect 130 extending from the source or drain of a TFT is connected with an extraction electrode (extraction terminal) 901, which in turn is used for connection with an external device.

Ceramic devices and other devices are fabricated on a substrate 301. Conductive interconnects 903 are also formed on the substrate 301 and connected with an extraction electrode (extraction terminal) 902, which in turn is connected with an external device. The conductive interconnects 903 are connected with an SAW device or inductor built on the substrate 301. Because of the structure described thus far, the modularized substrate can be directly inserted into a connector terminal of an apparatus. Furthermore, the apparatus can find wider application. In addition, the production cost can be reduced.

EMBODIMENT 7

The present embodiment is similar to the configuration of FIG. 7 except that a quartz substrate 701 is polished completely and that an aluminum nitride film 702 is used as a TFT substrate. The aluminum nitride film 702 is required to be rigid enough to be used as a substrate alone at least until the stage where this substrate is bonded to the substrate 301.

In this structure, heat generated by the TFTs can be radiated more effectively.

EMBODIMENT 8

The present embodiment provides the structure shown in FIG. 3(A) and is further characterized in that an active matrix liquid crystal display in an integrated form is fabricated on other portion (not shown). An active matrix circuit (not shown) is formed on the other portion of the quartz substrate 101 of FIG. 3(A). This quartz substrate 101 is used as a TFT substrate. Another substrate (not shown) that is transparent is employed as a counter substrate. These two substrates are cemented together via a liquid crystal material layer, thus completing the active matrix liquid crystal display. In this structure, the display device is modularized, in addition to the RF circuit.

EMBODIMENT 9

A process sequence for the present embodiment is illustrated in FIGS. 10(A)–11(B). In this embodiment, a TFT circuit is integrated with an SAW (surface acoustic wave) filter acting as a band-pass filter (BPF). In this specific embodiment, the SAW filter is connected with the output of a CMOS circuit.

First, a state as shown in FIG. 1(D) is obtained in the same way as in Embodiment 1. Then, an aluminum nitride film 1033 is formed over electrodes and conductive interconnects 130–132, as shown in FIG. 10(A). This aluminum nitride layer serves as a heat-radiating layer and also as a protective layer.

Then, the counter substrate having the SAW filter thereon is formed and bonded to the substrate 101. The counter substrate, 1034, is made of a ceramic or other appropriate material. A dielectric material 1035 consisting of barium titanate and electrodes 1036 are formed on the counter substrate 1034. Indicated by 1037 are contact electrodes.

Figure 11A:
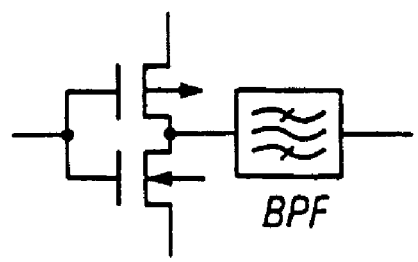
FIG. 11(A) is an equivalent circuit diagram of the hybrid device shown in FIGS. 10(A) and 10(B)
Figure 11B:
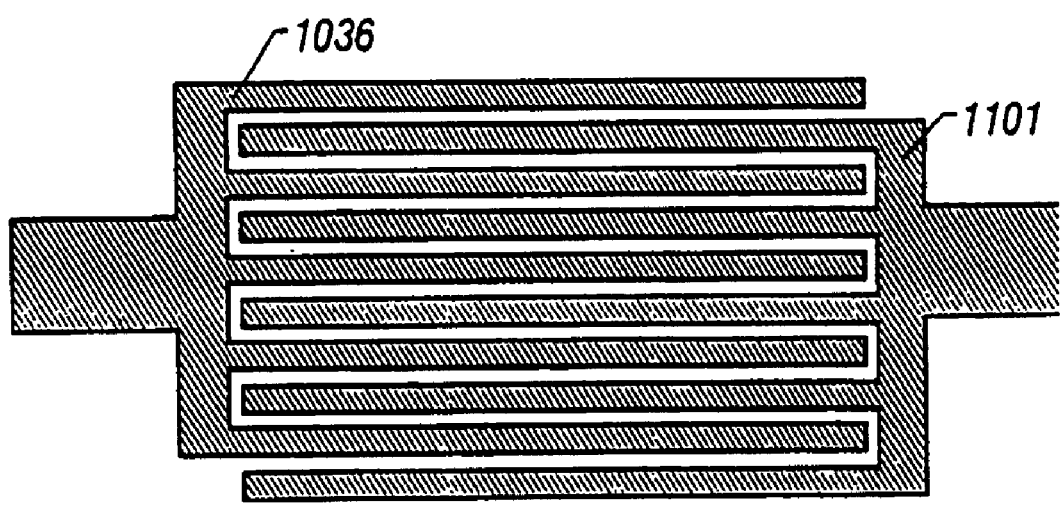
FIG. 11(B) is an enlarged top view of the hybrid device shown in FIGS. 10(A) and 10(B)

FIG. 1(B) is a top view of the SAW filter, which comprises comb-shaped electrodes 1036 and 1101 interdigitating each other on the dielectric material. This substrate 1034 is bonded to the substrate 101 via an adhesive layer 1038, thus completing a hybrid circuit of the TFT circuit and the SAW filter (FIG. 10(B)). FIG. 11(A) is an equivalent circuit diagram of the construction of FIG. 10(B).

Use of the configuration of the present embodiment makes it possible to integrate and modularize various circuits made up of TFTs and a filter component. In this way, an RF module used in a mobile phone or portable intelligent terminal can be accomplished. Such modularized commercial products permit miniaturization of mobile phones and portable intelligent terminals. Furthermore, lower costs can be achieved.

While the above embodiment gives an example in which an SAW filter is integrated with other circuits, other filters such as inductors, chip capacitors, and filters using ferrite can be integrated with other circuits.

EMBODIMENT 10

Figure 12:
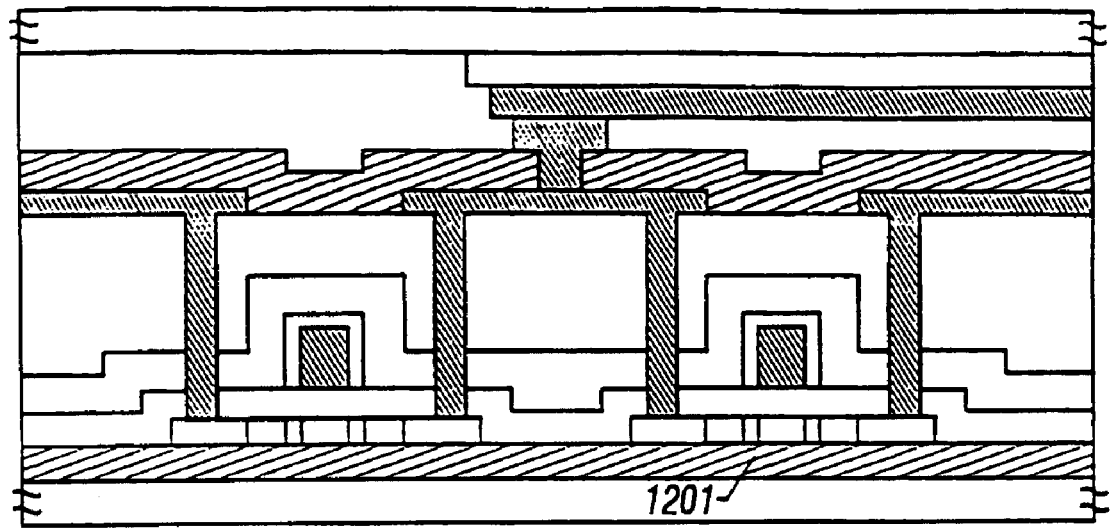
FIG. 12 is a cross-sectional view of another hybrid device consisting of TFTs and an SAW filter, the hybrid device being built in accordance with the invention.

The present embodiment is based on the structure of FIG. 10(B) and further characterized in that heat generated by the TFTs can be radiated more effectively. As shown in FIG. 12, an aluminum nitride film 1201 is formed on the substrate having the TFTs thereon. In this structure, the active layers of the TFTs are in direct contact with the cooling layer. This can further enhance the heat-radiating effect.

EMBODIMENT 11

Figure 13:
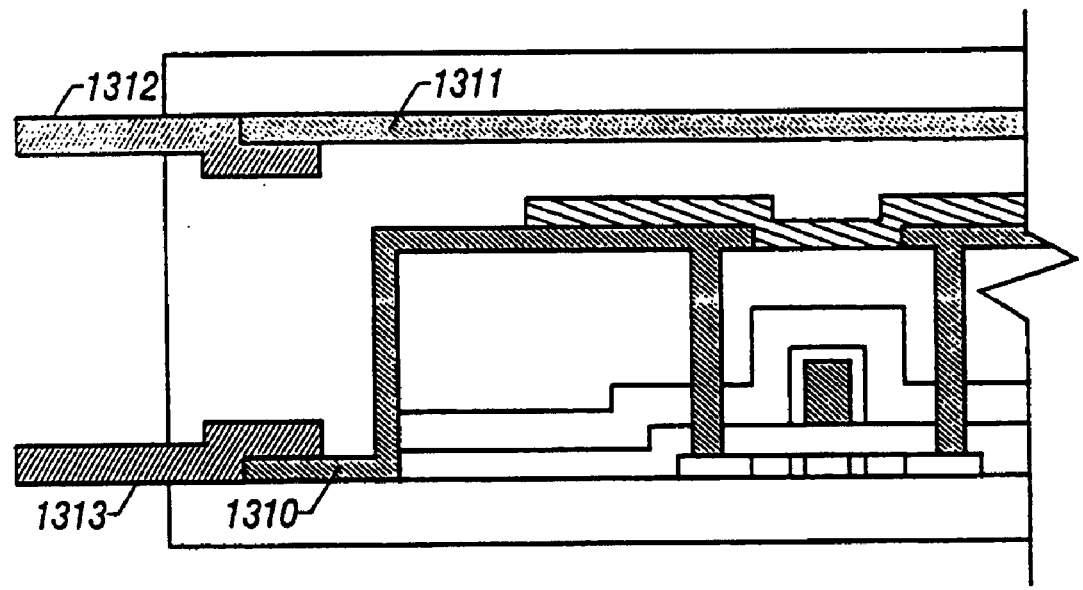
FIG. 13 is a fragmentary cross-sectional view of a marginal portion of a hybrid module in accordance with the invention.

The present embodiment gives a structure utilized where the configuration of FIG. 11(A) is used as a module. FIG. 13 shows a marginal portion of the module. A conductive interconnect 1310 extending from the source or drain of a TFT is shown to be connected with an extraction electrode (extraction terminal) 1313, which in turn is connected with an external device. Similarly, a conductive interconnect 1311 extending from a ceramic device or the like is shown to be connected with an extraction electrode (extraction terminal) 1312, which in turn is connected with an external device. Because of the structure described thus far, the modularized substrate can be directly inserted into a connector terminal of an apparatus. Furthermore, the apparatus can find wider application. In addition, the production cost can be decreased.

EMBODIMENT 12

The present embodiment is based on the structure shown in FIG. 10(B) and characterized in that an active matrix liquid crystal display in an integrated, form is formed on other portion (not shown). A liquid crystal material layer is sandwiched between the two substrates and thus the liquid crystal display can be disposed at this location. An RF circuit made up of TFTs and passive components can be integrated with the active matrix liquid crystal display. This structure is preferable as a component of a portable intelligent terminal.

EMBODIMENT 13

Figure 14A:
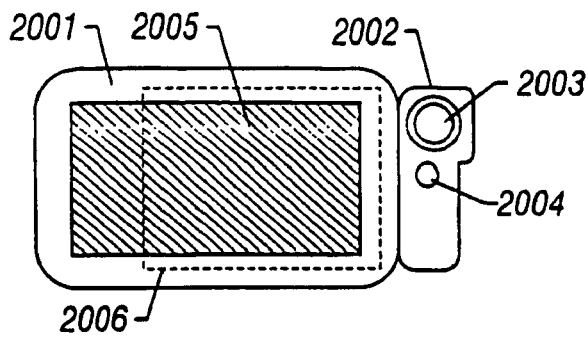
FIGS. 14(A)–14(F) are views showing electronic devices each incorporating a hybrid circuit including TFTs, the hybrid circuit being built in accordance with the invention.

The present embodiment gives an example of electronic device making use of a hybrid circuit of TFTs, passive components, and a ceramic device. FIG. 14(A) shows a portable intelligent terminal having a communications function utilizing a telephone network. The body 2001 of this electronic device incorporates an integrated circuit 2006 consisting of a hybrid circuit disclosed herein. The body further includes an active matrix liquid crystal display 2005, a camera portion 2002 for accepting images, an image pickup portion 2003, and control switches 2004.

Figure 14B:
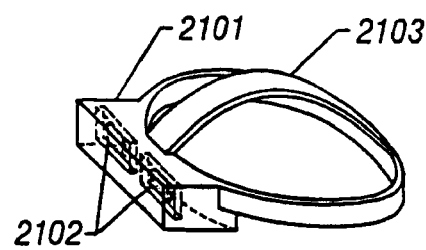

Referring to FIG. 14(B), there is shown a head mounted display that is one kind of electronic device. The user wears this display device on his or her head. An image is displayed in front of the eyes by virtual reality technology. The body, 2101, of the display device is attached to the head by a band 2103. The image is created by liquid crystal displays 2102 corresponding to the left and right eyes, respectively. Since this electronic device must be small and lightweight, the hybrid circuit disclosed herein is adapted to be used in this electronic device.

Figure 14C:
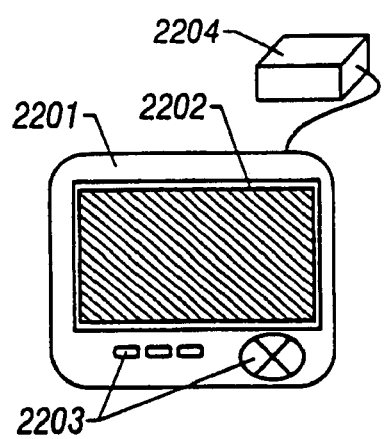

Referring next to FIG. 14(C), there is shown a display device having a function of displaying map information and other kinds of information according to signals sent from artificial satellites. Information sent from an artificial satellite is received by an antenna 2204 and processed by an electronic circuit incorporated in the body 2201. Requisite information is displayed on a liquid crystal display portion 2202. The display device is controlled, using control switches 2203. This display device is required to be devised so that the whole structure is miniaturized. Therefore, it is useful to use the hybrid circuit disclosed herein.

Figure 14D:
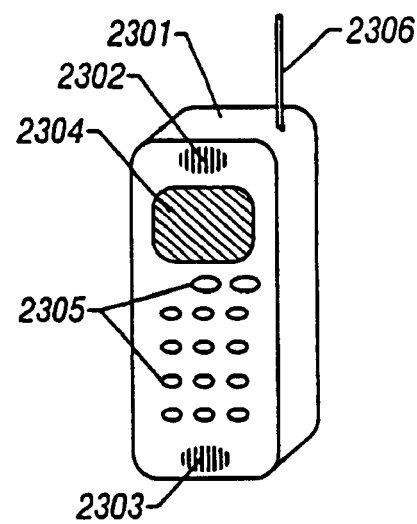

Referring next to FIG. 14(D), there is shown a mobile phone whose body is indicated by 2301. The body 2301 of this electronic device has an antenna 2306, a speech output portion 2302, a liquid crystal display 2304, control switches 2305, and a speech input portion 2303. It is useful for this electronic device to use the hybrid circuit disclosed herein in reducing the size of the whole construction.

Figure 15:
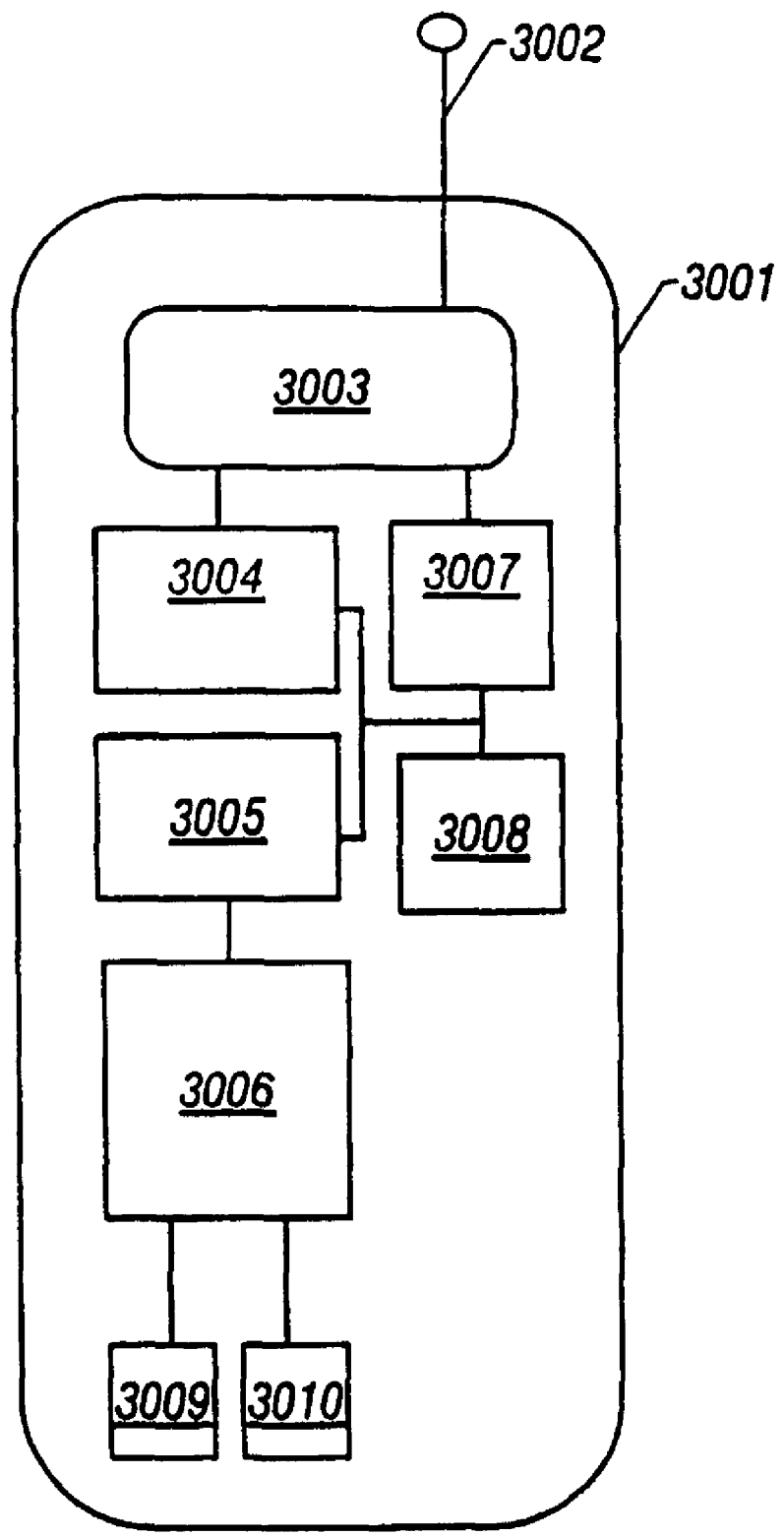
FIG. 15 is a block diagram of a mobile phone in accordance with the invention.

FIG. 15 is a block diagram of the electronic device shown in FIG. 14(D). The body of this device is indicated by numeral 301. In reception mode, electromagnetic waves are received by an antenna 3002 and sent to an RF input/output portion 3003. Then, the signals are supplied to a speech-processing portion 3006 via all of an RF control portion 3007, a modulating/demodulating portion 3004, and a channel coding portion 3005. The modulating/demodulating portion 3004 is under control of a CPU 3008. The speech-processing portion 3006 drives a loudspeaker 3010, which in turn produces audible information.

In oscillation mode, speech information is entered from a microphone 3009 and produced as electromagnetic waves from the antenna 3002 after passing through the route opposite in direction to the foregoing.

Figure 14E:
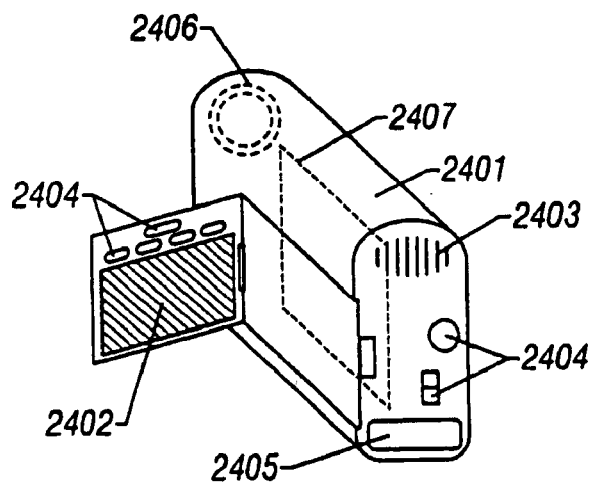

Referring next to FIG. 14(E), there is shown a video camera that is one kind of portable image pickup device. The body of this electronic device is indicated by reference numeral 2401 and has an openable member. A liquid crystal display 2402 and control switches 2404 are attached to the openable member. The body 2401 further includes an image pickup portion 2406, an integrated circuit 2407, a speech input portion 2403, operation switches 2404, and batteries 2405. It is useful for this electronic device to use the hybrid circuit disclosed herein in reducing the size of the whole construction. Especially, where an additional function such as a communications function is incorporated, it is necessary to incorporate an RF circuit in IC form for the added function. For this reason, the invention disclosed herein can be exploited beneficially.

Figure 14F:
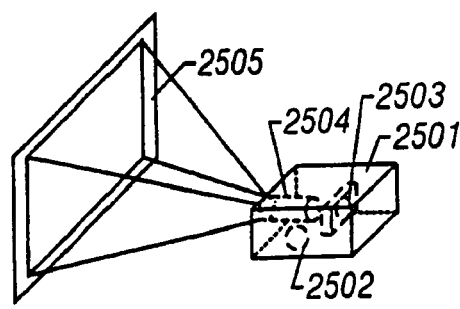

Referring next to FIG. 14(F). there is shown a projection type liquid crystal display that is another kind of electronic display. The body of this electronic display is indicated by numeral 2501 and has a light source 1502, a liquid crystal display 2503, and optics 2504. This projection type liquid crystal display has a function of projecting an image onto a screen 2505. Projection type displays are also required to be reduced in size and weight. Therefore, it is useful to exploit the present invention disclosed herein.

The above-described liquid crystal displays for electronic device can be either of the transmissive type or of the reflective type. The transmissive type is advantageous to achieve higher display characteristics. On the other hand, the reflective type is advantageous where lower power consumption, smaller size, and reduced weight -are sought for. Additionally, an active matrix electroluminescent display and a flat panel display such as a plasma display can be used as display devices.

EMBODIMENT 14

The present embodiment is based on the configuration of Embodiment 1 or 9 and characterized in that polycrystalline silicon wafers are used as substrates. All the substrates can be made of a polycrystalline silicon wafers. Alternatively, only the substrate on which TFTs or an SAW device is fabricated may be made of a polycrystalline silicon wafer. Polycrystalline silicon wafers are available at much lower costs than quartz substrates. Accordingly, this can contribute greatly to decreases in the costs of circuits and apparatus.

In the present embodiment, a silicon oxide film is grown to a thickness of 1 μm on a polycrystalline silicon wafer by plasma CVD. Then, thermal oxidation is carried out to form a thermal oxide film to a thickness of 50 nm (500 Å). Thus, a silicon oxide film having a flat surface and excellent interface characteristics can be grown on the polycrystalline silicon wafer. Using this silicon oxide film as a base layer. TFTs are fabricated on it.

Forming the: thermal oxide film directly on the polycrystalline silicon film and using this thermal oxide film as a base layer is undesirable, because the surface of the thermal oxide layer is made uneven due to the polycrystalline structure of the substrate. This would adversely affect the fabrication of the TFTs and hence their characteristics. It is possible to use a single-crystal silicon wafer instead of a polycrystalline silicon wafer. In this case, however, the advantage of low cost is sacrificed.

The present invention provides a novel structure in which an RF circuit capable of handling high frequencies in the GHz band can be fabricated in IC form. In particular, connector terminals or conductive interconnects extend through a substrate having TFTs thereon. A laminated device formed on another substrate is connected with these connector terminals. In consequence, a small-sized, RF module can be obtained in IC form. Utilizing the module in accordance with the invention, portable intelligent terminals can be made smaller in size and weight. Furthermore, lower costs can be accomplished.

What is claimed is:

1. A portable phone comprising:
   a body;
   a semiconductor device contained in the body, said semiconductor device comprising:
      a substrate;
      a passive component including at least an inductor formed over the substrate;
      an insulating film covering said passive component;
      an insulation layer attached to said insulating film via an adhesive;
      a circuit including at least one thin film transistor formed over said insulation layer,
   wherein said circuit is electrically connected to said passive component by at least one electrode through an opening of said insulation layer.

2. The portable phone according to claim 1 wherein said substrate is a quartz substrate.

3. The portable phone according to claim 1 wherein said insulation layer comprises aluminum nitride.

4. A portable phone comprising:
   a substrate;
   a passive component including at least a capacitor formed over the substrate;
   an insulating film covering said passive component;
   an insulation layer attached to said insulating film via an adhesive;
   a circuit including at least one thin film transistor formed over said insulation layer,
   wherein said circuit is electrically connected to said passive component by at least one electrode through an opening of said insulation layer.

5. The portable phone according to claim 4 wherein said substrate is a quartz substrate.

6. The portable phone according to claim 4 wherein said insulation layer comprises aluminum nitride.

7. A portable phone comprising:
   a body; and
   a semiconductor device contained in the body, said semiconductor device comprising:
      a substrate;
      a passive component including at least a SAW filter formed over the substrate;
      an insulating film covering said passive component;
      an insulation layer attached to said insulating film via an adhesive;
      a circuit including at least one thin film transistor formed over said insulation layer, wherein said circuit is electrically connected to said passive component by at least one electrode through an opening of said insulation layer.

8. The portable phone according to claim 7 wherein said substrate is a quartz substrate.

9. The portable phone according to claim 7 wherein said layer comprises aluminum nitride.

10. A portable phone comprising:
a body; and
a semiconductor device contained in the body, said semiconductor device comprising:
  a substrate;
  a passive component including at least a band-pass filter formed over the substrate;
  an insulating film covering said passive component;
  an insulation layer attached to said insulating film via an adhesive;
  a circuit including at least one thin film transistor formed over said insulation layer,
  wherein said circuit is electrically connected to said passive component by at least one electrode through an opening of said insulation layer.

11. The portable phone according to claim 10 wherein said substrate is a quartz substrate.

12. The portable phone according to claim 10 wherein said layer comprises aluminum nitride.

13. A portable phone comprising:
a body; and
a semiconductor device contained in the body, said semiconductor device comprising:
  a substrate;
  an oscillating component formed over the substrate;
  an insulating film covering said oscillating component;
  an insulation layer attached to said insulating film via an adhesive;
  a circuit including at least one thin film transistor formed over said insulation layer,
  wherein said circuit is electrically connected to said oscillating component by at least one electrode through an opening of said insulation layer.

14. The portable phone according to claim 13 wherein said substrate is a quartz substrate.

15. The portable phone according to claim 13 wherein said layer comprises aluminum nitride.

16. A semiconductor device capable of operating with a radio frequency, said semiconductor device comprising:
a substrate;
a passive component including at least an inductor formed over the substrate;
an insulating film covering said passive component;
an insulation layer attached to said insulating film via an adhesive; and
a circuit including at least one thin film transistor formed over said insulation layer,
wherein said circuit is electrically connected to said passive component by at least one electrode through an opening of said insulation layer.

17. The semiconductor device according to claim 16 wherein said substrate is a ceramic substrate.

18. The semiconductor device according to claim 16 wherein said insulation layer comprises aluminum nitride.

19. A semiconductor device capable of operating with a radio frequency, said semiconductor device comprising:
a substrate;
a passive component including at least a capacitor formed over the substrate;
an insulating film covering said passive component;
an insulation layer attached to said insulating film via an adhesive; and
a circuit including at least one thin film transistor formed over said insulation layer,
wherein said circuit is electrically connected to said passive component by at least one electrode through an opening of said insulation layer.

20. The semiconductor device according to claim 19 wherein said substrate is a ceramic substrate.

21. The semiconductor device according to claim 19 wherein said insulation layer comprises aluminum nitride.

22. A semiconductor device capable of operating with a radio frequency, said semiconductor device comprising:
a substrate;
a passive component including at least a SAW filter formed over the substrate;
an insulating film covering said passive component;
an insulation layer attached to said insulating film via an adhesive; and
a circuit including at least one thin film transistor formed over said insulation layer,
wherein said circuit is electrically connected to said passive component by at least one electrode through an opening of said insulation layer.

23. The semiconductor device according to claim 22 wherein said substrate is a ceramic substrate.

24. The semiconductor device according to claim 22 wherein said layer comprises aluminum nitride.

25. A semiconductor device capable of operating with a radio frequency, said semiconductor device comprising:
a substrate;
a passive component including at least a band-pass filter formed over the substrate;
an insulating film covering said passive component;
an insulation layer attached to said insulating film via an adhesive; and
a circuit including at least one thin film transistor formed over said insulation layer,
wherein said circuit is electrically connected to said passive component by at least one electrode through an opening of said insulation layer.

26. The semiconductor device according to claim 25 wherein said substrate is a ceramic substrate.

27. The semiconductor device according to claim 25 wherein said layer comprises aluminum nitride.

28. A semiconductor device capable of operating with a radio frequency, said semiconductor device comprising:
a substrate;
an oscillating component formed over the substrate;
an insulating film covering said oscillating component;
an insulation layer attached to said insulating film via an adhesive; and
a circuit including at least one thin film transistor formed over said insulation layer,
wherein said circuit is electrically connected to said passive component by at least one electrode through an opening of said insulation layer.

29. The semiconductor device according to claim 28 wherein said substrate is a ceramic substrate.

30. The semiconductor device according to claim 28 wherein said layer comprises aluminum nitride.

31. The semiconductor device according to claim 16 wherein said semiconductor device is a mobile phone.

32. The semiconductor device according to claim 19 wherein said semiconductor device is a mobile phone.

33. The semiconductor device according to claim 22 wherein said semiconductor device is a mobile phone.

34. The semiconductor device according to claim 25 wherein said semiconductor device is a mobile phone.

35. The semiconductor device according to claim 28 wherein said semiconductor device is a mobile phone.

36. The semiconductor device according to claim 16 wherein said semiconductor device is a portable intelligent terminal.

37. The semiconductor device according to claim 19 wherein said semiconductor device is a portable intelligent terminal.

38. The semiconductor device according to claim 22 wherein said semiconductor device is a portable intelligent terminal.

39. The semiconductor device according to claim 25 wherein said semiconductor device is a portable intelligent terminal.

40. The semiconductor device according to claim 28 wherein said semiconductor device is a portable intelligent terminal.

* * * * *